(12) United States Patent
Sirski et al.

(10) Patent No.: US 11,496,088 B2
(45) Date of Patent: Nov. 8, 2022

(54) PHOTOVOLTAIC MODULE FOR A ROOF WITH CONTINUOUS FIBER TAPE

(71) Applicant: GAF Energy LLC, Parsippany, NJ (US)

(72) Inventors: William Sirski, San Jose, CA (US); Alex Sharenko, Berkeley, CA (US); David Fredric Joel Kavulak, Fremont, CA (US); Nathan Peterson, Oakland, CA (US); Hamsini Gopalakrishna, Santa Clara, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/675,957

(22) Filed: Feb. 18, 2022

(65) Prior Publication Data

US 2022/0271702 A1    Aug. 25, 2022

Related U.S. Application Data

(60) Provisional application No. 63/151,510, filed on Feb. 19, 2021.

(51) Int. Cl.
*H02S 20/23*    (2014.01)
*E04D 5/10*    (2006.01)
(Continued)

(52) U.S. Cl.
CPC .............. *H02S 20/23* (2014.12); *C09J 7/20* (2018.01); *C09J 7/381* (2018.01); *E04D 5/10* (2013.01); *E04D 5/148* (2013.01)

(58) Field of Classification Search
CPC ... H02S 20/23; C09J 7/20; C09J 7/381; E04D 5/10; E04D 5/148; Y02B 10/10; Y02E 10/50
See application file for complete search history.

(56) References Cited

U.S. PATENT DOCUMENTS

| 1,981,467 A | 11/1934 | Radtke |
| 3,156,497 A | 11/1964 | Lessard |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Phi D A
(74) *Attorney, Agent, or Firm* — Greenberg Traurig LLP

(57) ABSTRACT

Some embodiments of the present disclosure relate to photovoltaic module for use on a roof. In some embodiments, the photovoltaic module may include a solar cell and a polymeric continuous fiber tape. In some embodiments, the polymeric continuous fiber tape comprises a polymer and glass fiber. In some embodiments, the glass fiber is present in an amount greater than about 50% by weight based on a total weight of the polymeric continuous fiber tape. In some embodiments, the polymeric continuous fiber tape comprises an elastic modulus greater than 1 GPa and an optical transmission greater than 80%.

17 Claims, 2 Drawing Sheets

(51) Int. Cl.
  *C09J 7/20* (2018.01)
  *C09J 7/38* (2018.01)
  *E04D 5/14* (2006.01)

(56) References Cited

U.S. PATENT DOCUMENTS

| | | | |
|---|---|---|---|
| 4,258,948 A | 3/1981 | Hoffmann | |
| 4,349,220 A | 9/1982 | Carroll et al. | |
| 4,499,702 A | 2/1985 | Turner | |
| 4,636,577 A | 1/1987 | Peterpaul | |
| 5,167,579 A | 12/1992 | Rotter | |
| 5,590,495 A | 1/1997 | Bressler et al. | |
| 5,642,596 A | 7/1997 | Waddington | |
| 6,008,450 A | 12/1999 | Ohtsuka et al. | |
| 6,046,399 A | 4/2000 | Kapner | |
| 6,320,114 B1 | 11/2001 | Kuechler | |
| 6,336,304 B1 | 1/2002 | Mimura et al. | |
| 6,341,454 B1 | 1/2002 | Koleoglou | |
| 6,407,329 B1 | 6/2002 | Iino et al. | |
| 6,576,830 B2 | 6/2003 | Nagao et al. | |
| 6,928,781 B2 | 8/2005 | Desbois et al. | |
| 6,972,367 B2 | 12/2005 | Federspiel et al. | |
| 7,138,578 B2 | 11/2006 | Komamine | |
| 7,155,870 B2 | 1/2007 | Almy | |
| 7,178,295 B2 | 2/2007 | Dinwoodie | |
| 7,487,771 B1 | 2/2009 | Eiffert et al. | |
| 7,587,864 B2 | 9/2009 | McCaskill et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Podirsky | |
| 7,832,176 B2 | 11/2010 | McCaskill et al. | |
| 8,118,109 B1 | 2/2012 | Hacker | |
| 8,168,880 B2 | 5/2012 | Jacobs et al. | |
| 8,173,889 B2 | 5/2012 | Kalkanoglu et al. | |
| 8,210,570 B1 | 7/2012 | Railkar et al. | |
| 8,276,329 B2 | 10/2012 | Lenox | |
| 8,312,693 B2 | 11/2012 | Cappelli | |
| 8,319,093 B2 | 11/2012 | Kalkanoglu et al. | |
| 8,333,040 B2 | 12/2012 | Shiao et al. | |
| 8,371,076 B2 | 2/2013 | Jones et al. | |
| 8,375,653 B2 | 2/2013 | Shiao et al. | |
| 8,404,967 B2 | 3/2013 | Kalkanoglu et al. | |
| 8,410,349 B2 | 4/2013 | Kalkanoglu et al. | |
| 8,418,415 B2 | 4/2013 | Shiao et al. | |
| 8,438,796 B2 | 5/2013 | Shiao et al. | |
| 8,468,754 B2 | 6/2013 | Railkar et al. | |
| 8,468,757 B2 | 6/2013 | Krause et al. | |
| 8,505,249 B2 | 8/2013 | Geary | |
| 8,512,866 B2 | 8/2013 | Taylor | |
| 8,513,517 B2 | 8/2013 | Kalkanoglu et al. | |
| 8,586,856 B2 | 11/2013 | Kalkanoglu et al. | |
| 8,601,754 B2 | 12/2013 | Jenkins et al. | |
| 8,629,578 B2 | 1/2014 | Kurs et al. | |
| 8,646,228 B2 | 2/2014 | Jenkins | |
| 8,656,657 B2 | 2/2014 | Livsey et al. | |
| 8,671,630 B2 | 3/2014 | Lena et al. | |
| 8,677,702 B2 | 3/2014 | Jenkins | |
| 8,695,289 B2 | 4/2014 | Koch et al. | |
| 8,713,858 B1 | 5/2014 | Xie | |
| 8,713,860 B2 | 5/2014 | Railkar et al. | |
| 8,733,038 B2 | 5/2014 | Kalkanoglu et al. | |
| 8,789,321 B2 | 7/2014 | Ishida | |
| 8,793,940 B2 | 8/2014 | Kalkanoglu et al. | |
| 8,793,941 B2 | 8/2014 | Bosler et al. | |
| 8,826,607 B2 | 9/2014 | Shiao et al. | |
| 8,835,751 B2 | 9/2014 | Kalkanoglu et al. | |
| 8,863,451 B2 | 10/2014 | Jenkins et al. | |
| 8,898,970 B2 | 12/2014 | Jenkins et al. | |
| 8,925,262 B2 | 1/2015 | Railkar et al. | |
| 8,943,766 B2 | 2/2015 | Gombarick et al. | |
| 8,946,544 B2 | 2/2015 | Jabos et al. | |
| 8,950,128 B2 | 2/2015 | Kalkanoglu et al. | |
| 8,959,848 B2 | 2/2015 | Jenkins et al. | |
| 8,966,838 B2 | 3/2015 | Jenkins | |
| 8,966,850 B2 | 3/2015 | Jenkins et al. | |
| 8,994,224 B2 | 3/2015 | Mehta et al. | |
| 9,032,672 B2 | 5/2015 | Livsey et al. | |
| 9,166,087 B2 | 10/2015 | Chihlas et al. | |
| 9,169,646 B2 | 10/2015 | Rodrigues et al. | |
| 9,170,034 B2 | 10/2015 | Bosler et al. | |
| 9,178,465 B2 | 11/2015 | Shiao et al. | |
| 9,202,955 B2 | 12/2015 | Livsey et al. | |
| 9,212,832 B2 | 12/2015 | Jenkins | |
| 9,217,584 B2 | 12/2015 | Kalkanoglu et al. | |
| 9,270,221 B2 | 2/2016 | Zhao | |
| 9,273,885 B2 | 3/2016 | Rordigues et al. | |
| 9,276,141 B2 | 3/2016 | Kalkanoglu et al. | |
| 9,331,224 B2 | 5/2016 | Koch et al. | |
| 9,356,174 B2 | 5/2016 | Duarte et al. | |
| 9,359,014 B1 | 6/2016 | Yang et al. | |
| 9,528,270 B2 | 12/2016 | Jenkins et al. | |
| 9,605,432 B1 | 3/2017 | Robbins | |
| 9,711,672 B2 | 7/2017 | Wang | |
| 9,755,573 B2 | 9/2017 | Livsey et al. | |
| 9,786,802 B2 | 10/2017 | Shiao et al. | |
| 9,831,818 B2 | 11/2017 | West | |
| 9,912,284 B2 | 3/2018 | Svec | |
| 9,923,515 B2 | 3/2018 | Rodrigues et al. | |
| 9,938,729 B2 | 4/2018 | Coon | |
| 9,991,412 B2 | 6/2018 | Gonzalez et al. | |
| 9,998,067 B2 | 6/2018 | Kalkanoglu et al. | |
| 10,027,273 B2 | 7/2018 | West et al. | |
| 10,115,850 B2 | 10/2018 | Rodrigues et al. | |
| 10,128,660 B1 | 11/2018 | Apte et al. | |
| 10,187,005 B2 | 1/2019 | Rodrigues et al. | |
| 10,256,765 B2 | 4/2019 | Rodrigues et al. | |
| 10,454,408 B2 | 10/2019 | Livsey et al. | |
| 10,530,292 B1 | 1/2020 | Cropper et al. | |
| 10,560,048 B2 | 2/2020 | Fisher et al. | |
| 10,563,406 B2 | 2/2020 | Kalkanoglu et al. | |
| D879,031 S | 3/2020 | Lance et al. | |
| 10,784,813 B2 | 9/2020 | Kalkanoglu et al. | |
| D904,289 S | 12/2020 | Lance et al. | |
| 11,012,026 B2 | 5/2021 | Kalkanoglu et al. | |
| 11,177,639 B1 | 11/2021 | Nguyen et al. | |
| 11,217,715 B2 | 1/2022 | Sharenko et al. | |
| 11,251,744 B1 | 2/2022 | Bunea et al. | |
| 11,258,399 B2 | 2/2022 | Kalkanoglu et al. | |
| 11,283,394 B2 | 3/2022 | Perkins et al. | |
| 2002/0053360 A1 | 5/2002 | Kinoshita et al. | |
| 2002/0129849 A1 | 9/2002 | Heckeroth | |
| 2003/0101662 A1 | 6/2003 | Ullman | |
| 2003/0132265 A1 | 7/2003 | Villela et al. | |
| 2003/0217768 A1 | 11/2003 | Guha | |
| 2005/0115603 A1 | 6/2005 | Yoshida et al. | |
| 2005/0144870 A1 | 7/2005 | Dinwoodie | |
| 2006/0042683 A1 | 3/2006 | Gangemi | |
| 2007/0181174 A1 | 8/2007 | Ressler | |
| 2007/0193618 A1 | 8/2007 | Bressler et al. | |
| 2008/0006323 A1 | 1/2008 | Kalkanoglu et al. | |
| 2008/0035140 A1 | 2/2008 | Placer et al. | |
| 2008/0271774 A1 | 11/2008 | Kalkanoglu et al. | |
| 2008/0315061 A1 | 12/2008 | Fath | |
| 2009/0000222 A1 | 1/2009 | Kalkanoglu et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0133340 A1 | 5/2009 | Shiao et al. | |
| 2009/0159118 A1 | 6/2009 | Kalkanoglu et al. | |
| 2009/0178350 A1 | 7/2009 | Kalkanoglu et al. | |
| 2009/0229652 A1 | 9/2009 | Mapel et al. | |
| 2010/0101634 A1 | 4/2010 | Frank et al. | |
| 2010/0139184 A1 | 6/2010 | Williams et al. | |
| 2010/0146878 A1 | 6/2010 | Koch et al. | |
| 2010/0159221 A1 | 6/2010 | Kourtakis et al. | |
| 2010/0313499 A1 | 12/2010 | Gangemi | |
| 2010/0326488 A1 | 12/2010 | Aue et al. | |
| 2010/0326501 A1 | 12/2010 | Zhao et al. | |
| 2011/0030761 A1 | 2/2011 | Kalkanoglu et al. | |
| 2011/0036386 A1 | 2/2011 | Browder | |
| 2011/0036389 A1 | 2/2011 | Hardikar et al. | |
| 2011/0048507 A1 | 3/2011 | Livsey et al. | |

(56) References Cited

U.S. PATENT DOCUMENTS

| | | | |
|---|---|---|---|
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0239555 A1 | 10/2011 | Cook et al. |
| 2011/0302859 A1 | 12/2011 | Crasnianski |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0312366 A1* | 12/2012 | Starry ................. H01L 31/049 428/324 |
| 2013/0008499 A1 | 1/2013 | Verger et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0254776 A1 | 9/2014 | O'Connor et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179726 A1 | 6/2017 | Garrity et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0331652 A1* | 11/2018 | Okawa ................. H02S 40/36 |
| 2018/0351502 A1 | 12/2018 | Almy et al. |
| 2019/0027624 A1* | 1/2019 | Stutterheim ...... H01L 31/03926 |
| 2019/0030867 A1 | 1/2019 | Sun et al. |
| 2019/0081436 A1 | 3/2019 | Onodi et al. |
| 2019/0177520 A1* | 6/2019 | Aarnio-Winterhof ... C08K 3/34 |
| 2019/0305717 A1 | 10/2019 | Allen et al. |
| 2019/0334046 A1 | 10/2019 | Ikoma et al. |
| 2020/0109320 A1 | 4/2020 | Jiang |
| 2020/0144958 A1 | 5/2020 | Rodrigues et al. |
| 2020/0162017 A1* | 5/2020 | Cassagne ............... H02S 20/23 |
| 2020/0220819 A1 | 7/2020 | Vu et al. |
| 2020/0224419 A1 | 7/2020 | Boss et al. |
| 2020/0232173 A1* | 7/2020 | De Bettignies ......... F21V 23/06 |
| 2020/0266759 A1* | 8/2020 | Okawa ................ H01R 12/585 |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0234499 A1* | 7/2021 | Franco ................... H02S 20/00 |
| 2021/0265516 A1* | 8/2021 | Van Mierloo ........ C08K 5/3475 |
| 2021/0320615 A1* | 10/2021 | Abra ...................... H02S 20/23 |
| 2021/0343886 A1* | 11/2021 | Sharenko .............. H01L 31/048 |
| 2021/0351311 A1* | 11/2021 | Cassagne ............. H01L 31/049 |
| 2022/0033679 A1* | 2/2022 | Van Duijnhoven .... C09J 151/06 |
| 2022/0059712 A1* | 2/2022 | Barbot ................... H01L 31/18 |
| 2022/0069155 A1* | 3/2022 | Barbot ................ H01L 31/0481 |
| 2022/0115979 A1* | 4/2022 | Perkins ..................... E04D 1/30 |
| 2022/0149213 A1* | 5/2022 | Mensink ................. H02S 40/20 |
| 2022/0149219 A1* | 5/2022 | Lemesanszkine-Piszkor ............. H01L 31/049 |

FOREIGN PATENT DOCUMENTS

| | | | |
|---|---|---|---|
| CN | 202797032 U | 3/2013 | |
| DE | 1958248 A1 | 11/1971 | |
| EP | 1837162 A1 | 9/2007 | |
| EP | 1774372 A1 | 7/2011 | |
| EP | 2784241 A1 | 10/2014 | |
| EP | 3657551 A1 * | 5/2020 | ....... H01L 31/02167 |
| JP | 2001-098703 A | 10/2002 | |
| JP | 2017-027735 A | 2/2017 | |
| WO | 2011/049944 A1 | 4/2011 | |
| WO | 2015/133632 A1 | 9/2015 | |
| WO | 2019/201416 A1 | 10/2019 | |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

PHOTOVOLTAIC MODULE FOR A ROOF WITH CONTINUOUS FIBER TAPE

CROSS-REFERENCE TO RELATED APPLICATIONS

This application claims priority to U.S. Provisional Application No. 63/151,510, filed on Feb. 19, 2021, and titled "Photovoltaic Module for a Roof with Continuous Fiber Tape," the entire contents of which are incorporated by reference herein in their entirety.

FIELD

The present disclosure relates to photovoltaic modules for roofs with continuous fiber tape and methods of manufacturing photovoltaic modules with continuous fiber tape.

BACKGROUND

Some roofing systems include photovoltaic modules. In some instances, the photovoltaic modules may include solar cells and regions for protecting the solar cells.

SUMMARY

Covered embodiments are defined by the claims, not this summary. This summary is a high-level overview of various aspects and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

Some embodiments of the present disclosure are directed to a photovoltaic module for use on a roof, the photovoltaic module comprising: a solar cell, and a polymeric continuous fiber tape, wherein the polymeric continuous fiber tape comprises a polymer; and glass fiber, wherein the glass fiber is in an amount greater than about 55% by weight based on a total weight of the polymeric continuous fiber tape; and wherein the polymeric continuous fiber tape comprises an elastic modulus greater than 1 GPa; and an optical transmission greater than 80%.

In some embodiments, the glass fiber is in an amount from 55% by weight to 70% by weight based on a total weight of the polymeric continuous fiber tape.

In some embodiments, when the photovoltaic module is installed on a roof, the roof comprises a class A fire resistance rating according to UL 790.

In some embodiments, the polymeric continuous fiber tape comprises a flammability rating of V-2 to 5 VA when tested according to UL 94.

In some embodiments, the polymeric continuous fiber tape comprises a dielectric strength from 20 kV/mm to 50 kV/mm when tested according to ASTM D149.

In some embodiments, the optical transmission of the polymeric continuous fiber tape is from 80% to 95%.

In some embodiments, the glass fiber comprises continuous glass fiber.

In some embodiments, the glass fiber comprises unidirectional glass fiber.

In some embodiments, the glass fiber comprises extruded glass fiber.

In some embodiments, the polymeric continuous fiber tape comprises a flexure strength in a direction of the continuous glass fiber from 150 MPa to 500 MPa according to ASTM D7624.

In some embodiments, the polymer comprises polyolefin.

In some embodiments, the polymeric continuous fiber tape comprises a thickness from 100 μm to 1000 μm.

In some embodiments, the polymeric continuous fiber tape comprises a thickness from 200 μm to 500 μm.

Some embodiments of the present disclosure are directed to a method comprising: obtaining glass fiber tape; obtaining a polymer; and combining the glass fiber tape and the polymer so as to form a polymeric continuous fiber tape comprising: glass fiber in an amount greater than about 55% by weight based on a total weight of the polymeric continuous fiber tape; an elastic modulus greater than 1 GPa; and an optical transmission greater than 80%.

In some embodiments, the glass fiber tape comprises extruded glass fiber tape.

In some embodiments, combining the glass fiber tape and the polymer includes combining the glass fiber tape and the polymer using a melt impregnation process.

In some embodiments, the glass fiber is in an amount from 55% by weight to 70% by weight based on a total weight of the polymeric continuous fiber tape.

In some embodiments, the optical transmission of the polymeric continuous fiber tape is from 80% to 95%.

In some embodiments, the glass fiber comprises continuous glass fiber.

In some embodiments, the glass fiber comprises unidirectional glass fiber.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
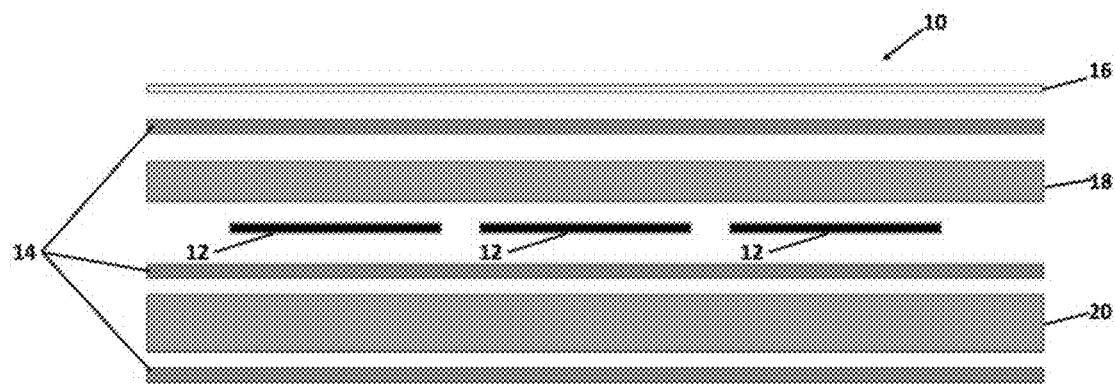
FIG. 1 depicts an exploded cross-sectional view of an exemplary embodiment of a photovoltaic module.

Among those benefits and improvements that have been disclosed other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, terms such as "comprising" "including," and "having" do not limit the scope of a specific claim to the materials or steps recited by the claim.

As used herein, the term "consisting essentially of" limits the scope of a specific claim to the specified materials or steps and those that do not materially affect the basic and novel characteristic or characteristics of the specific claim.

As used herein, terms such as "consisting of" and "composed of" limit the scope of a specific claim to the materials and steps recited by the claim.

As used herein, the term "continuous fiber" means an elongated strand of fiber.

As used herein, the term "tape" refers to a strip of material that is configured to adhere to a material.

As used herein, the term "continuous fiber tape" refers to a composite tape that includes continuous fiber.

As used herein, the term "polymeric continuous fiber tape" refers to a composite tape that includes a polymer and continuous fiber.

All prior patents, publications, and test methods referenced herein are incorporated by reference in their entireties.

Some embodiments of the present invention relate to a photovoltaic module. In some embodiments the photovoltaic module may be sized and/or shaped for use on a roof. In some embodiments, the photovoltaic module may be a solar panel. In some embodiments, the photovoltaic module may be a solar shingle. In some embodiments, the photovoltaic module may be a solar shingle that may be a comparable size and/or shape to asphalt shingles.

In some embodiments, the photovoltaic module includes a solar cell. In some embodiments, the photovoltaic module includes a plurality of solar cells. In some embodiments, the solar cell may include a top surface and a bottom surface. In some embodiments, the photovoltaic module may include at least one region stacked on the top surface of the solar cell. In some embodiments, the photovoltaic module may include at least one region stacked on the bottom surface of the solar cell.

In some embodiments, at least one region stacked on the top and/or bottom surface of the solar cell may include a polymeric continuous fiber tape. In some embodiments, the polymeric continuous fiber tape may include a polymer. In some embodiments, the polymer may include polyolefin, cyclic polyolefin, ethylene-vinyle acetate ("EVA"), polyurethane, epoxy, polyester, acrylic, or any combination thereof.

In some embodiments, the polymeric continuous fiber tape may include glass fiber. In some embodiments, the polymeric continuous glass fiber tape may include a sufficient amount of glass fiber so as to result in the polymeric continuous fiber tape comprising an elastic modulus greater than 1 Gpa when tested according to ASTM D638 and an optical transmission greater than 80%. In some embodiments, when the photovoltaic module is installed on a roof, the roof comprises a class A fire resistance rating according to UL 790.

In some embodiments, the sufficient amount of glass fiber may be an amount greater than 50% by weight based on a total weight of the polymeric continuous glass fiber tape. In some embodiments, the sufficient amount of glass fiber may be an amount greater than 55% by weight based on a total weight of the polymeric continuous glass fiber tape. In some embodiments, the sufficient amount of glass fiber may be an amount of 55% by weight to 90% by weight, of 55% by weight to 80% by weight, of 55% by weight to 70% by weight, or of 55% by weight to 60% by weight based on a total weight of the polymeric continuous glass fiber tape. In some embodiments, the sufficient amount of glass fiber may be an amount of 60% by weight to 90% by weight, of 70% by weight to 90% by weight, or of 80% by weight to 90% by weight based on a total weight of the polymeric continuous glass fiber tape. In some embodiments, the sufficient amount of glass fiber may be an amount of 60% by weight to 80% by weight based on a total weight of the polymeric continuous glass fiber tape.

In some embodiments, the polymeric continuous fiber tape with the sufficient amount of glass fiber has an optical transmission greater than 80%. In some embodiments, the polymeric continuous fiber tape has an optical transmission of 80% to 100%, of 80% to 95%, of 80% to 90%, of 80% to 85%, of 85% to 100%, of 90% to 100%, of 95% to 100%, or of 85% to 95%.

In some embodiments, the percent of optical transmission may be determined using a spectrophotometer, including for example, a PerkinElmer® Lambda 1050 spectrophotometer. In some embodiments, the percent of optical transmission may be determined using a spectrophotometer with an integrating sphere, including for example, a 270 mm integrating sphere.

In some embodiments, the polymeric continuous fiber tape with the sufficient amount of glass fiber has a dielectric strength greater than 20 kV/mm when tested according to ASTM D149. In some embodiments, the polymeric continuous fiber tape with the sufficient amount of glass fiber has a dielectric strength of 20 kV/mm to 50 kV/mm when tested according to ASTM D149, of 20 kV/mm to 45 kV/mm when tested according to ASTM D149, of 20 kV/mm to 40 kV/mm when tested according to ASTM D149, of 20 kV/mm to 35 kV/mm when tested according to ASTM D149, of 20 kV/mm to 30 kV/mm when tested according to ASTM D149, of 20 kV/mm to 25 kV/mm when tested according to ASTM D149, of 25 kV/mm to 50 kV/mm when tested according to ASTM D149, of 30 kV/mm to 50 kV/mm when tested according to ASTM D149, of 35 kV/mm to 50 kV/mm when tested according to ASTM D149, of 40 kV/mm to 50 kV/mm when tested according to ASTM D149, of 45 kV/mm to 50 kV/mm when tested according to ASTM D149, of 25 kV/mm to 45 kV/mm when tested according to ASTM D149, or of 30 kV/mm to 40 kV/mm when tested according to ASTM D149.

In some embodiments, the polymeric continuous fiber tape comprises a thickness of 100 µm to 1000 µm, of 200 µm to 1000 µm, of 300 µm to 1000 µm, of 400 µm to 1000 µm, of 500 µm to 1000 µm, of 600 µm to 1000 µm, of 700 µm to 1000 µm, of 800 µm to 1000 µm, of 900 µm to 1000 µm, of 100 µm to 900 µm, of 100 µm to 800 µm, 100 µm to 700 µm, 100 µm to 600 µm, of 100 µm to 500 µm, of 100 µm to 400 μm, 100 μm to 300 μm, 100 μm to 200 μm, 200 μm to 900 μm, 300 μm to 800 μm, 400 μm to 700 μm, or of 500 μm to 600 μm.

In some embodiments, the polymeric continuous fiber tape comprises a thickness of 200 μm to 500 μm, of 200 μm to 450 μm, of 200 μm to 400 μm, of 200 μm to 350 μm, of 200 μm to 300 μm, of 200 μm to 250 μm, of 250 μm to 500 μm, of 300 μm to 500 μm, of 350 μm to 500 μm, of 400 μm to 500 μm, of 450 μm to 500 μm, of 250 μm to 450 μm, or of 300 μm to 400 μm.

In some embodiments, the glass fiber may be continuous glass fiber, unidirectional glass fiber, extruded glass fiber, mat glass fiber, weave glass fiber, or any combination thereof.

In some embodiments, the polymeric continuous fiber tape comprises a flexure strength in the direction of the continuous glass fiber. In some embodiments, the polymeric continuous fiber tape with the sufficient amount of glass fiber has a flexure strength in the direction of the continuous glass fiber greater than 300 Mpa. In some embodiments, the polymeric continuous fiber tape with the sufficient amount of glass fiber has a flexure strength in the direction of the continuous glass fiber of 150 Mpa to 500 Mpa according to ASTM D7624.

In some embodiments, the polymeric continuous fiber tape with the sufficient amount of glass fiber has a flexure strength in the direction of the continuous fiber of 150 Mpa to 450 Mpa, of 150 Mpa to 400 Mpa, of 150 Mpa to 350 Mpa, of 150 Mpa to 300 Mpa, of 150 Mpa to 250 Mpa, of 150 Mpa to 200 Mpa, of 200 Mpa to 500 Mpa, of 250 Mpa to 500 Mpa, of 300 Mpa to 500 Mpa, of 350 Mpa to 500 Mpa, of 400 Mpa to 500 Mpa, of 450 Mpa to 500 Mpa, of 200 Mpa to 450 Mpa, of 250 Mpa to 400 Mpa, or of 300 Mpa to 350 Mpa according to ASTM D7624.

In some embodiments, the polymeric continuous fiber tape is configured to be flame resistant. In some embodiments, the polymeric continuous fiber tape comprises a flammability rating of V-2 to 5 VA when tested according to UL 94.

In some embodiments, the polymeric continuous fiber tape may be a region stacked on the top surface of the solar cell. In some embodiments, the polymeric continuous fiber tape may be a region stacked on the bottom surface of the solar cell. In some embodiments, the photovoltaic module may include a plurality of regions of polymeric continuous fiber tape that may be stacked on the top and/or bottom surfaces of the solar cell. In some embodiments, the region of polymeric continuous fiber tape may be a single layer of polymeric continuous fiber tape. In some embodiments, the region of polymeric continuous fiber tape may include a plurality of layers of polymeric continuous fiber tape.

In some embodiments, the plurality of regions of polymeric continuous fiber tape may be stacked so that the continuous glass fiber in each region is parallel to one another. In some embodiments, the plurality of regions of polymeric continuous fiber tape may be stacked so that the continuous glass fiber in one region is perpendicular to the continuous glass fiber in another region. In some embodiments, the plurality of regions of polymeric continuous fiber tape may be stacked so that the continuous glass fiber in one region is angled relative to the continuous glass fiber in another region. In some embodiments, the angle may be 0 degrees to 90 degrees, 10 degrees to 90 degrees, 20 degrees to 90 degrees, 30 degrees to 90 degrees, 40 degrees to 90 degrees, 50 degrees to 90 degrees, 60 degrees to 90 degrees, 70 degrees to 90 degrees, 80 degrees to 90 degrees, 0 degrees to 80 degrees, 0 degrees to 70 degrees, 0 degrees to 60 degrees, 0 degrees to 50 degrees, 0 degrees to 40 degrees, 0 degrees to 30 degrees, to 0 degrees to 20 degrees, 0 degrees to 10 degrees, 10 degrees to 80 degrees, 20 degrees to 70 degrees, 30 degrees to 60 degrees, or 40 degrees to 50 degrees.

In some embodiments, the plurality of regions of polymeric continuous fiber tape may include a first polymeric continuous fiber tape, a second polymeric continuous fiber tape, and a third polymeric continuous fiber tape. In some embodiments, the first, second, and third polymeric continuous fiber tapes may be spaced apart from one another in the photovoltaic module. In some embodiments, the second polymeric continuous fiber tape may be in a region between the first polymeric continuous fiber tape and the third polymeric continuous fiber tape in the photovoltaic module.

In some embodiments, the thickness of each region of polymeric continuous fiber tape may be the same. In some embodiments, each region of polymeric continuous fiber tape may each include a different thickness.

In some embodiments, a distance between the first polymeric continuous fiber tape and the second polymeric continuous fiber tape is at least 1 mm. In some embodiments, a distance between the first polymeric continuous fiber tape and the second polymeric continuous fiber tape is 1 mm to 6 mm, 1 mm to 5 mm, 1 mm to 4 mm, 1 mm to 3 mm, 1 mm to 2 mm, 2 mm to 6 mm, 3 mm to 6 mm, 4 mm to 6 mm, 5 mm to 6 mm, 2 mm to 5 mm, or 3 mm to 4 mm.

In some embodiments, a distance between the first polymeric continuous fiber tape and the third polymeric continuous fiber tape is at least 1 mm. In some embodiments, a distance between the first polymeric continuous fiber tape and the third polymeric continuous fiber tape is 1 mm to 6 mm, 1 mm to 5 mm, 1 mm to 4 mm, 1 mm to 3 mm, 1 mm to 2 mm, 2 mm to 6 mm, 3 mm to 6 mm, 4 mm to 6 mm, 5 mm to 6 mm, 2 mm to 5 mm, or 3 mm to 4 mm.

In some embodiments, a distance between the second polymeric continuous fiber tape and the third polymeric continuous fiber tape is at least 1 mm. In some embodiments, a distance between the second polymeric continuous fiber tape and the third polymeric continuous fiber tape is 1 mm to 6 mm, 1 mm to 5 mm, 1 mm to 4 mm, 1 mm to 3 mm, 1 mm to 2 mm, 2 mm to 6 mm, 3 mm to 6 mm, 4 mm to 6 mm, 5 mm to 6 mm, 2 mm to 5 mm, or 3 mm to 4 mm.

In some embodiments, the photovoltaic module may include a transparent sheet. In some embodiments, the transparent sheet may be a region stacked on the top surface of the solar cell. In some embodiments, the transparent sheet may include any sufficiently transparent material, including for example, glass. In some embodiments, the photovoltaic module does not have a transparent sheet.

In some embodiments, the transparent sheet has a thickness of 10 μm to 200 μm, of 10 μm to 180 μm, of 10 μm to 160 μm, of 10 μm to 140 μm, of 10 μm to 120 μm, of 10 μm to 100 μm, of 10 μm to 80 μm, of 10 μm to 60 μm, of 10 μm to 40 μm, of 10 μm to 20 μm, of 30 μm to 200 μm, of 50 μm to 200 μm, of 70 μm to 200 μm, of 90 μm to 200 μm, of 110 μm to 200 μm, of 130 μm to 200 μm, of 150 μm to 200 μm, of 170 μm to 200 μm, of 190 μm to 200 μm, of 30 μm to 180 μm, of 50 μm to 160 μm, of 70 μm to 140 μm, or of 90 μm to 120 μm.

In some embodiments, the photovoltaic module may include an encapsulant. In some embodiments, the encapsulant may be a region stacked on the top or bottom surface of the solar cell. In some embodiments, the photovoltaic module may include a plurality of regions of encapsulant stacked on the top and/or bottom surface of the solar cell. In some embodiments, the encapsulant may include polyolefin, silicone, EVA, or any combination thereof.

In some embodiments, the encapsulant has a thickness of 200 µm to 1000 µm, of 200 µm to 900 µm, of 200 µm to 800 µm, of 200 µm to 700 µm, of 200 µm to 600 µm, of 200 µm to 500 µm, of 200 µm to 400 µm, of 200 µm to 300 µm, of 300 µm to 1000 µm, of 400 µm to 1000 µm, of 500 µm to 1000 µm, of 600 µm to 1000 µm, of 700 µm to 1000 µm, of 800 µm to 1000 µm, of 900 µm to 1000 µm, of 300 µm to 900 µm, of 400 µm to 800 µm, or of 500 µm to 700 µm.

In some embodiments, the photovoltaic module may include a core. In some embodiments, the core may be a region stacked on the top or bottom surface of the solar cell. In some embodiments, the core may include closed cell foam, open cell foam, honeycomb board, a pure polymer material, including, for example, thermoplastic polyolefin, or any combination thereof.

In some embodiments, the core has a thickness of 800 µm to 2000 µm, of 900 µm to 2000 µm, of 1000 µm to 2000 µm, of 1100 µm to 2000 µm, of 1200 µm to 2000 µm, of 1300 µm to 2000 µm, of 1400 µm to 2000 µm, of 1500 µm to 2000 µm, of 1600 µm to 2000 µm, of 1700 µm to 2000 µm, of 1800 µm to 2000 µm, of 1900 µm to 2000 µm, of 800 µm to 1900 µm, of 800 µm to 1800 µm, of 800 µm to 1700 µm, of 800 µm to 1700 µm, of 800 µm to 1600 µm, of 800 µm to 1500 µm, of 800 µm to 1400 µm, of 800 µm to 1300 µm, of 800 µm to 1200 µm, of 800 µm to 1100 µm, of 800 µm to 1000 µm, of 800 µm to 900 µm, of 900 µm to 1900 µm, of 1000 µm to 1800 µm, of 1100 µm to 1700 µm, of 1200 µm to 1600 µm, or of 1300 µm to 1500 µm.

In some embodiments, the solar cell may include a top surface and a bottom surface. In some embodiments, the photovoltaic module may include at least one region stacked on the top surface of the solar cell. In some embodiments, the photovoltaic module may include at least one region stacked on the bottom surface of the solar cell.

Some embodiments of the present disclosure may relate to a method. In some embodiments, the method may include obtaining glass fiber tape. In some embodiments, the glass fiber tape may be continuous glass fiber tape, extruded glass fiber tape, unidirectional glass fiber tape, or any combination thereof.

In some embodiments, the method may include obtaining a polymer. In some embodiments, the polymer may include polyolefin, including, for example, polyethylene, polypropylene, or combinations thereof.

In some embodiments, the method may include combining the glass fiber tape and the polymer so as to form a polymeric continuous fiber tape as described herein. For example, in some embodiments, the polymeric continuous fiber tape may include glass fiber in amount greater than 55% by weight based on a total weight of the polymeric continuous fiber tape, a strength module greater than 1 Gpa, and an optical transmission greater than 80%.

In some embodiments, the glass fiber tape and the polymer may be combined using a melt impregnation process. In some embodiments, the melt impregnation process includes impregnating the glass fiber tape with the polymer so as to form the polymeric continuous fiber tape.

The present disclosure will now be described with reference to non-limiting exemplary embodiments depicted in FIGS. 1-3.

FIG. 1 depicts an exploded cross-sectional view of an exemplary embodiment of a photovoltaic module 10. As shown in FIG. 1, the photovoltaic module includes a plurality of solar cells 12 and a plurality of regions 14, 16, 18, 20 stacked above and below the solar cells 12. In the exemplary embodiment of FIG. 1, the plurality of regions includes three regions of polymeric continuous fiber tape 14. As shown in FIG. 1, the polymeric continuous fiber tape 14 is disposed in the photovoltaic module 10 above and below the solar cells 12. In addition, the plurality of regions includes a transparent sheet 16, an encapsulant 18, and a core 20.

Figure 2:
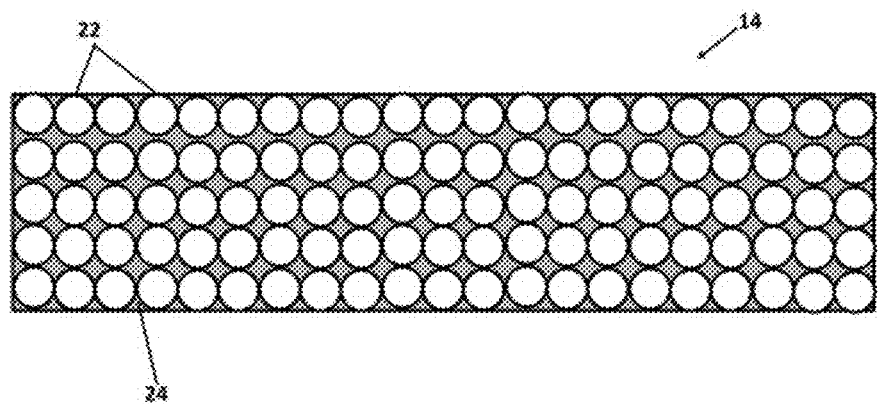
FIG. 2 depicts a cross-sectional view of an exemplary embodiment of a polymeric continuous fiber tape.

FIG. 2 depicts a cross-sectional view of an exemplary embodiment of a polymeric continuous fiber tape 14. As shown in FIG. 2, the polymeric continuous fiber tape includes glass fiber 22. In the exemplary embodiment of FIG. 2, the glass fiber 22 is continuous glass fiber, which may be unidirectional and distributed throughout the polymeric continuous fiber tape. In addition, as shown in FIG. 2, the polymeric continuous fiber tape includes a polymer 24. In the exemplary embodiment of FIG. 2, the polymer 24 may be a polyolefin. The polyolefin may be impregnated in the polymeric continuous fiber tape.

Figure 3:
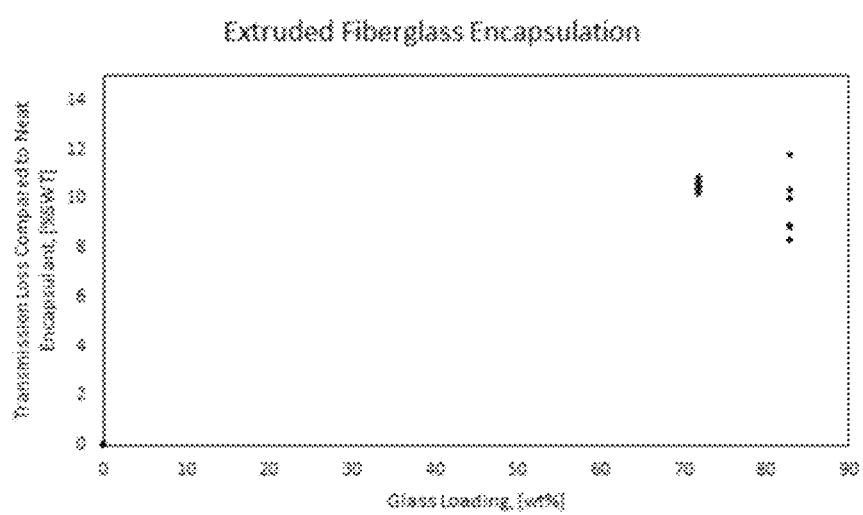
FIG. 3 depicts a graph showing the percent of optical transmission loss in polymeric continuous fiber tapes loaded with glass fiber in an amount greater than 50% by weight based on a total weight of the polymeric continuous fiber tape.

FIG. 3 depicts a graph showing the percent of optical transmission loss in samples of polymeric continuous fiber tapes loaded with glass fiber. The samples of polymeric continuous fiber tape were loaded with glass fiber in an amount greater than 50% by weight based on a total weight of the polymeric continuous fiber tape in accordance with the method described above. The amount of optical transmission for each sample was then tested using a PerkinElmer® Lambda 1050 spectrophotometer with a 270 mm integrating sphere. The obtained spectra for each sample was then weighted against the AM 1.5 standard solar spectrum. In addition, the amount of optical transmission for an encapsulant not loaded with glass fiber was obtained. The percent of optical transmission loss was obtained by comparing the optical transmission of each sample to the optical transmission of the encapsulant not loaded with glass fiber.

Variations, modifications and alterations to embodiments of the present disclosure described above will make themselves apparent to those skilled in the art. All such variations, modifications, alterations and the like are intended to fall within the spirit and scope of the present disclosure, limited solely by the appended claims.

While several embodiments of the present disclosure have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

Any feature or element that is positively identified in this description may also be specifically excluded as a feature or element of an embodiment of the present as defined in the claims.

The disclosure described herein may be practiced in the absence of any element or elements, limitation or limitations, which is not specifically disclosed herein. Thus, for example, in each instance herein, any of the terms "comprising," "consisting essentially of and "consisting of" may be replaced with either of the other two terms, without altering their respective meanings as defined herein. The terms and expressions which have been employed are used as terms of description and not of limitation, and there is no intention in the use of such terms and expressions of excluding any equivalents of the features shown and described or portions thereof, but it is recognized that various modifications are possible within the scope of the disclosure.

What is claimed:

1. A roofing system, comprising:
   a roof substrate; and
   a photovoltaic module comprising:
   a solar cell,
   an encapsulant,
   wherein at least a portion of the encapsulant is located above the solar cell, and
   a first polymeric continuous fiber tape,
   wherein the first polymeric continuous fiber tape is located above the solar cell,
   wherein the first polymeric continuous fiber tape comprises
   a. a polymer; and
   b. glass fiber,
   wherein the glass fiber is in an amount greater than about 55% by weight based on a total weight of the first polymeric continuous fiber tape; and
   wherein the first polymeric continuous fiber tape comprises
   a. an elastic modulus greater than 1 GPa; and
   b. an optical transmission greater than 80%, and
   wherein the photovoltaic module is located above the roof substrate so the first polymeric continuous fiber tape is located above both the roof substrate and the solar cell.

2. The roofing system of claim 1, wherein the glass fiber is in an amount from 55% by weight to 70% by weight based on a total weight of the polymeric continuous fiber tape.

3. The roofing system of claim 1, wherein the roof substrate comprises a class A fire resistance rating according to UL 790.

4. The roofing system of claim 1, wherein the first polymeric continuous fiber tape comprises a flammability rating of V-2 to 5VA when tested according to UL 94.

5. The roofing system of claim 1, wherein the first polymeric continuous fiber tape comprises a dielectric strength from 20 kV/mm to 50 kV/mm when tested according to ASTM D149.

6. The roofing system of claim 1, wherein the optical transmission of the first polymeric continuous fiber tape is from 80% to 95%.

7. The roofing system of claim 1, wherein the glass fiber comprises continuous glass fiber.

8. The roofing system of claim 1, wherein the glass fiber comprises unidirectional glass fiber.

9. The roofing system of claim 1, wherein the glass fiber comprises extruded glass fiber.

10. The roofing system of claim 1, wherein the first polymeric continuous fiber tape comprises a flexure strength in a direction of the continuous glass fiber from 150 MPa to 500 MPa according to ASTM D7624.

11. The roofing system of claim 1, wherein the polymer comprises polyolefin.

12. The roofing system of claim 1, wherein the first polymeric continuous fiber tape comprises a thickness from 100 μm to 1000 μm.

13. The roofing system of claim 1, wherein the first polymeric continuous fiber tape comprises a thickness from 200 μm to 500 μm.

14. The roofing system of claim 1, wherein the photovoltaic module further comprises:
   a second polymeric continuous fiber tape,
   wherein the second polymeric continuous fiber tape is located on an opposite side of the solar cell than the first polymeric continuous fiber tape.

15. The roofing system of claim 1, wherein the photovoltaic module further comprises:
   a transparent sheet,
   wherein the transparent sheet is located above the solar cell.

16. The roofing system of claim 15, wherein the transparent sheet comprises glass.

17. A roofing system, comprising:
   a roof substrate;
   a first plurality of photovoltaic modules located above the roof substrate,
   wherein each of the first plurality of photovoltaic modules comprises:
   a solar cell; and
   a second plurality of photovoltaic modules located above the roof substrate,
   wherein each of the second plurality of photovoltaic modules comprises:
   a first layer,
   wherein the first layer is composed of a thermoplastic polyolefin;
   a second layer,
   wherein the second layer is composed of a continuous fiber tape;
   a third layer,
   wherein the third layer is composed of a thermoplastic polyolefin; and
   a fourth layer,
   wherein the fourth layer is composed of a continuous fiber tape.

* * * * *